United States Patent [19]

Liken et al.

[11] Patent Number: 5,528,161
[45] Date of Patent: Jun. 18, 1996

[54] THROUGH-PORT LOAD CARRIER AND RELATED TEST APPARATUS

[75] Inventors: Peter A. Liken, West Olive; Steven B. Ensing, Wyoming, both of Mich.

[73] Assignee: Venturedyne Limited, Milwaukee, Wis.

[21] Appl. No.: 306,709

[22] Filed: Sep. 15, 1994

[51] Int. Cl.⁶ ........................................... G01R 31/02
[52] U.S. Cl. ........................................... 324/760; 324/158.1
[58] Field of Search ............................... 324/158.1, 537, 324/760, 73.1; 219/209, 210

[56] References Cited

U.S. PATENT DOCUMENTS

| | | | |
|---|---|---|---|
| 3,656,058 | 4/1972 | Leathers | 324/158 F |
| 4,145,620 | 3/1979 | Dice | 307/149 |
| 4,148,534 | 4/1979 | Veburg | 312/236 |
| 4,607,220 | 8/1986 | Hollman | 324/158 F |
| 4,633,175 | 12/1986 | Ritchie et al. | 324/158 F |
| 4,636,726 | 1/1987 | Santomango et al. | 324/158 F |
| 4,659,986 | 4/1987 | Elster | 324/158 F |
| 4,683,424 | 7/1987 | Cutright et al. | 324/158 F |
| 4,692,694 | 9/1987 | Yokoi et al. | 324/158 F |
| 4,695,707 | 9/1987 | Young | 219/392 |
| 4,725,775 | 2/1988 | McMinn | 324/158 F |
| 4,745,354 | 5/1988 | Fraser | 324/73 R |
| 4,766,371 | 8/1988 | Moriya | 324/158 F |
| 4,767,983 | 8/1988 | Pfaff | 324/158 F |
| 4,777,434 | 10/1988 | Miller et al. | 324/158 F |
| 4,779,047 | 10/1988 | Solstad et al. | 324/158 F |
| 4,799,021 | 1/1989 | Cozzi | 324/73 R |
| 4,812,758 | 3/1989 | Yamashita et al. | 324/209 |
| 4,949,031 | 8/1990 | Szasz | 324/158 F |
| 5,003,156 | 3/1991 | Kilpatrick et al. | 219/209 |
| 5,072,177 | 12/1991 | Liken et al. | 324/158 F |
| 5,204,618 | 4/1993 | Matsuoka | 324/158 R |
| 5,216,360 | 6/1993 | Gelzer et al. | 324/158 F |
| 5,216,361 | 6/1993 | Akar et al. | 324/158 F |
| 5,278,494 | 1/1994 | Obigane | 324/158 F |

*Primary Examiner*—Ernest F. Karlsen
*Assistant Examiner*—Russell M. Kobert
*Attorney, Agent, or Firm*—Jansson & Shupe, Ltd.

[57] ABSTRACT

Disclosed is a load carrier for use with a test chamber. Such carrier includes (a) an insertion portion having a length about equal to the thickness of a chamber wall, (b) a carrier portion extending away from the chamber and (c) a flange interposed between the portions for sealing contact with the wall. The insertion portion extends through an opening in a chamber wall to connect to a rack holding printed circuit boards. The carrier portion holds a test device connected to the circuit boards through the load carrier. The load carrier is removable and can operate in "standalone" fashion or be tested at a location remote from the chamber when another load carrier is substituted in the chamber. Chamber backplane wiring is eliminated or substantially eliminated.

11 Claims, 5 Drawing Sheets

THROUGH-PORT LOAD CARRIER AND RELATED TEST APPARATUS

FIELD OF THE INVENTION

This invention relates generally to electrical measuring and testing and, more particularly, to testing of electrical components under load.

1. Background of the Invention

Most types of electronic equipment, e.g., aircraft navigation devices and the like, incorporate circuit boards made of a thin, flat dielectric sheet. The sheet has resistors, capacitors, integrated circuits and other components mounted on it. While some boards are entirely "hard-wired" using conventional soldered wiring, printed circuit boards (or "PC boards") are now much more common. Such PC boards employ flat foil strips (applied to the dielectric sheet by a process akin to printing) as the "wiring" for component interconnection.

Many applications for circuit boards involve hostile operating environments particularly including temperature extremes and, sometimes, rapid excursions between such extremes. Unless recognized in board construction and testing, such environments can cause premature failure of the board per se and/or of the components mounted thereon. For example, radios used in mobile equipment such as military vehicles often experience extremes of heat and cold. And aircraft electronic gear similarly experiences such extremes—but over a much shorter time span. For example, a military aircraft may be at summer desert temperatures and at subzero temperature at high altitude only a few minutes later.

And, of course, PC boards are used in other, less "dramatic" applications such as TV sets, automotive air bag release circuits and the like. But even such equipment can be subjected to harsh environmental conditions from time to time.

To help assure that circuit boards provide the requisite degree of reliability in such applications, board manufacturers often subject them to temperature tests by placing them within environmental chambers capable of producing rapid and extreme changes in temperature. For example, such a chamber might provide a temperature change of from −40° F. to over 200° F. in about 30 minutes. A prominent designer and manufacturer of such environmental test chambers is Thermotron Industries, Inc., of Holland, Mich.

A significant concern of manufacturers of circuit boards (or of products containing such circuit boards) is the relative ease or difficulty with which the configuration of the test apparatus can be modified. "Short run" testing (sequential testing of a relatively small quantity of boards of each of several different types) requires that the circuitry used to impose load on the boards and to record test results be changed.

And even when testing a single type of circuit board, it may be necessary to change the test procedure and/or to modify the instrumentation used in the test. Such changes can involve substantial "down time" when the environmental chamber cannot be used—idle capital equipment adds to cost.

Yet another aspect of known environmental chambers involves what is known as "back plane" connectors and "through-the-wall" wiring. The interior surface of the chamber rear wall is often referred to as the back plane. Several multi-prong electrical connectors are mounted on such rear wall and wires extend from such connectors through the rear wall and to test instrumentation located somewhat remotely from the chamber itself. Installation of such connectors and related wiring represents a cost to the chamber manufacturer and once installed, are very difficult to "re-configure" with, for example, other types of connectors and/or other wiring arrangements.

Further, the aforementioned type of arrangement requires that the electronic equipment used to load and test the circuit boards be remotely mounted on a bench or the like. And when so mounted, the equipment has to be "hard-wired" (physically connected to) the "through-the-wall" wiring mentioned above. Such wiring takes time to put into place and is somewhat difficult to change or repair.

Patents generally related to electrical measuring and testing include U.S. Pat. Nos. 4,145,620 (Dice) and 4,949,031 (Szasz et al.). The Dice patent involves a burn-in chamber and a separate standalone power supply, one module of which is a sequencer having a programming card that plugs in through a front slot. The chamber contains two "bay modules," each of which has a number of horizontally-arranged cards mounted for test. The bay modules are inserted into the chamber from the rear and a number of socket cards are plugged in from the chamber front. The patent suggests that the number of socket cards and the number of cards to be tested are equal. When a socket card is plugged to a card which is to undergo test, both cards are confined completely inside the closed chamber.

The Szasz et al. patent depicts a test chamber which has front doors and a large rear opening which is rectangular in shape. A product carrier pallet is front-loaded into the chamber using a transport cart. The rear side of the pallet has an integrally-constructed rectangular rear chamber plug which fits into and seals the rear opening when the pallet is properly positioned. In effect, the rear plug becomes a large part of the backplane when the pallet is in place.

Removable feedthrough boards are on the rear plug and connect to a load board module through zero-force connectors. It is the load board module which includes the test electronics.

A load carrier and related test apparatus which can substantially reduce chamber downtime, which offers dramatic improvements in application flexibility, which substantially eliminates back plane connectors and through-the-wall wiring and which closely "couples" circuit boards and electronic equipment used to test such boards and which is very easy to modify would be an important advance in the art.

2. Objects of the Invention

It is an object of the invention to provide an improved load carrier and related test apparatus overcoming some of the problems and shortcomings of the prior art.

Another object of the invention is to provide an improved load carrier and related test apparatus which can substantially reduce chamber downtime.

Another object of the invention is to provide an improved load carrier and related test apparatus which offers dramatic improvements in application flexibility.

Yet another object of the invention is to provide an improved load carrier and related test apparatus which substantially eliminates back plane connectors and through-the-wall wiring.

Another object of the invention is to provide an improved load carrier and related test apparatus which closely "couples" circuit boards and electronic equipment used to test such boards.

Still another object of the invention is to provide an improved load carrier and related test apparatus which is very easy to modify. How these and other objects are accomplished will become apparent from the following descriptions and from the drawing.

SUMMARY OF THE INVENTION

Aspects of the invention involve a load carrier for use with an enclosed test chamber such as an environmental chamber used for testing printed circuit boards. Such circuit boards are tested under load and the term "load carrier" is apt since it "carries" the circuitry used to impose a load upon the circuit boards during board testing.

The carrier includes a carrier portion an insertion portion, the latter having a length about equal to the thickness of a chamber wall. Each portion is generally rectangular in shape. The insertion portion has a cross-sectional area and the carrier portion has a cross-sectional area greater than that of the insertion portion. A flange is interposed between the portions and its surface provides sealing contact with the chamber wall so that moisture is substantially prevented from migrating between the chamber interior cavity and the ambient air surrounding the chamber.

In another aspect of the invention, the insertion portion includes an end panel on which is mounted a male multi-prong electrical connector. The carrier portion (which juts "cantilever-fashion" outward away from the chamber wall) contains a test device such as instrumentation and board-loading circuitry. Wires extend between the connector and the test device and, preferably, the carrier portion includes a slide rack for mounting the test device.

Environmental chambers are often used with a "work cell" computer remotely mounted from the test chamber. The circuit boards are connected to the computer through the load carrier. More specifically, the circuit boards are mounted in a drawer-like rack, sometimes also referred to as a "carrier." The rack has edge connectors to "interface" the rack with the boards and such edge connectors are wired to a female multi-prong electrical connector on the end of the rack.

When the rack is in place in the chamber, the circuit boards are connected to the male connector on the insertion portion, the insertion portion is connected to the test device and the test device is connected to the computer. Thus, the innovative load carrier "links" the circuit boards under test to the work cell computer.

Other aspects of the invention include a test apparatus comprising the chamber and the load carrier. Such chamber has a wall with an opening through it and the insertion portion extends into such opening. The length of the insertion portion is about equal to the thickness of the chamber wall. Thus, when the load carrier is fully inserted into the chamber wall, the insertion portion end panel is substantially coplanar with the interior surface of such wall and the male fitting on such panel protrudes slightly for easy engagement with the female fitting on the rack. The circuit boards are thereby electrically connected to the load carrier.

The new load carrier eliminates or substantially eliminates so-called "back plane" wiring, i.e., wiring installed on the interior surface of a chamber wall, usually the back wall. The load carrier is very easy to "plug" into the opening in the chamber wall and to remove for easy maintenance of the load carrier itself. And, of course, the load carrier is taken "off line" very readily (by simply unplugging such carrier) for "bench-testing" or modifying the test device in such carrier. One need only remove one load carrier and plug in a substitute load carrier in its place.

Further details of the invention are set forth in the following detailed description and in the drawing.

DETAILED DESCRIPTION OF PREFERRED EMBODIMENTS

In this specification, terms like "front," "rear," "inside" and the like are used. Such terms are based upon, e.g., the front and rear of an exemplary chamber and upon the relationship of parts to the chamber or to parts of the chamber. And such terms are for ease of explanation and are not intended to limit the invention.

Figure 1:
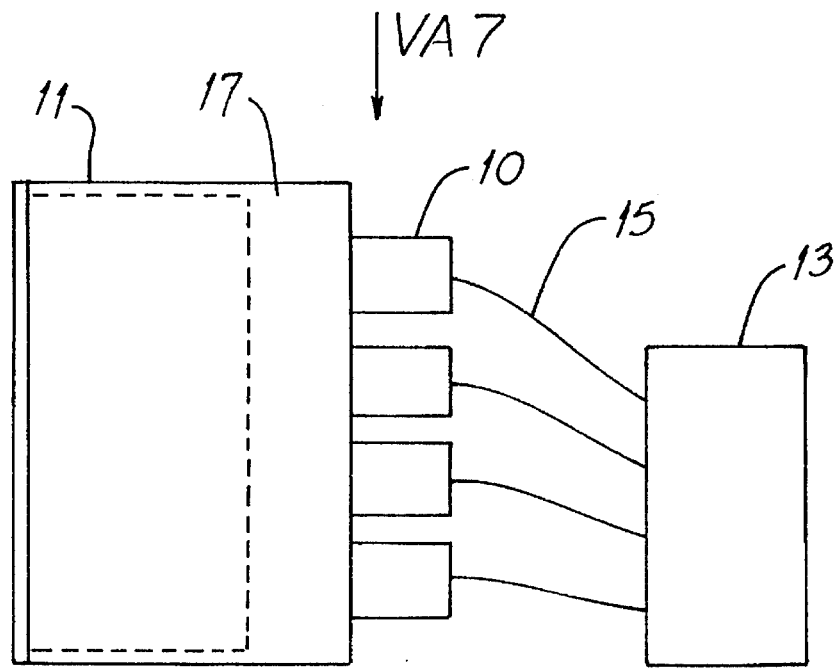
FIG. 1 is a representative side elevation view showing an environmental test chamber equipped with load carriers and showing related electronic test equipment. Certain surfaces are shown in dashed outline.

Referring first to FIG. 1, the new "through-port" load carrier 10 is shown in conjunction with an environmental test chamber 11 and electronic equipment 13 used to gather data and otherwise carry out testing of, for example, printed circuit boards contained within the chamber 11. The carrier 10 and the equipment 13 are connected together by wires 15. A typical chamber 11 is equipped with heating and refrigeration equipment and, often, humidification equipment (not shown) permitting rapid and dramatic excursions of the temperature and humidity in the chamber 11.

Figure 2:
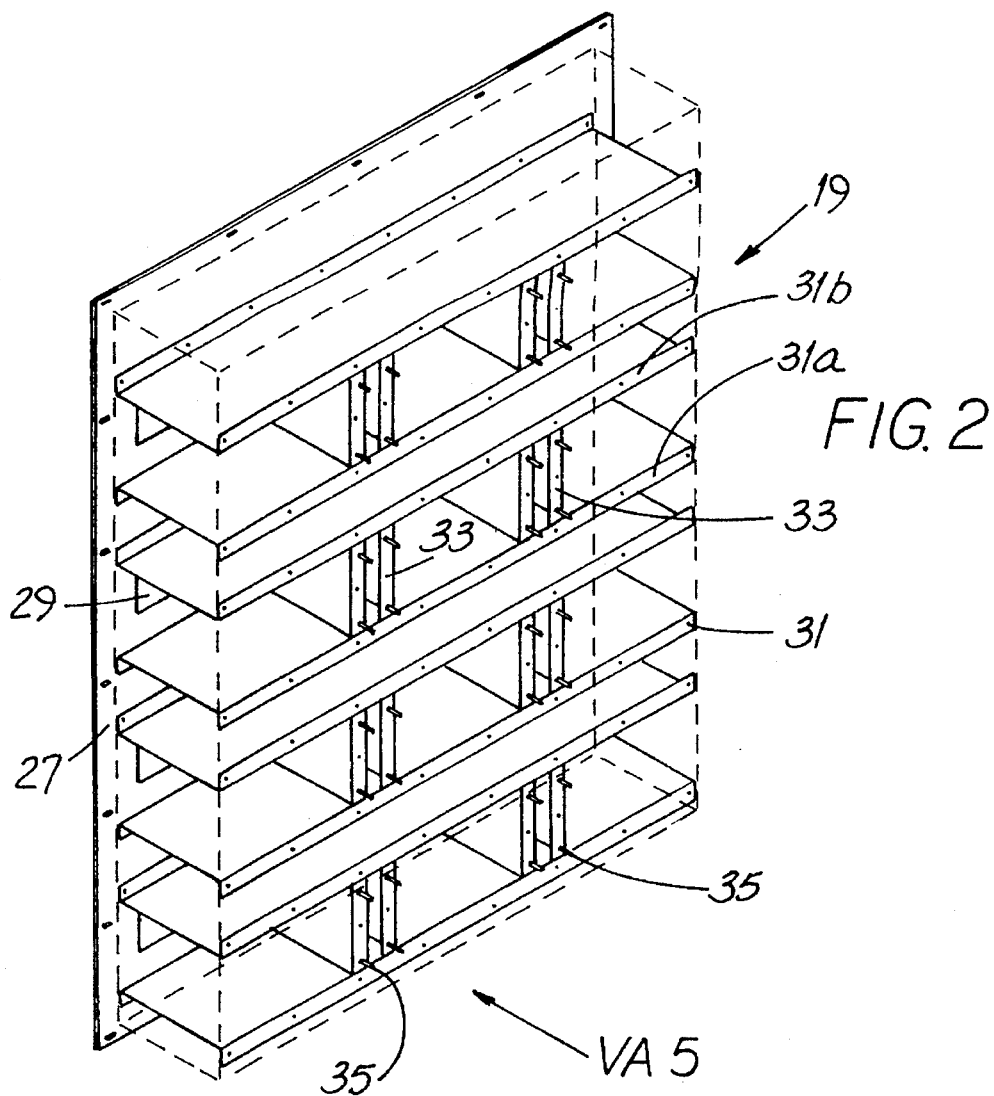
FIG. 2 is a perspective view of a partitioning frame used to make the rear wall of the test chamber shown in FIG. 1. Certain surfaces are shown in dashed outline.
Figure 3:
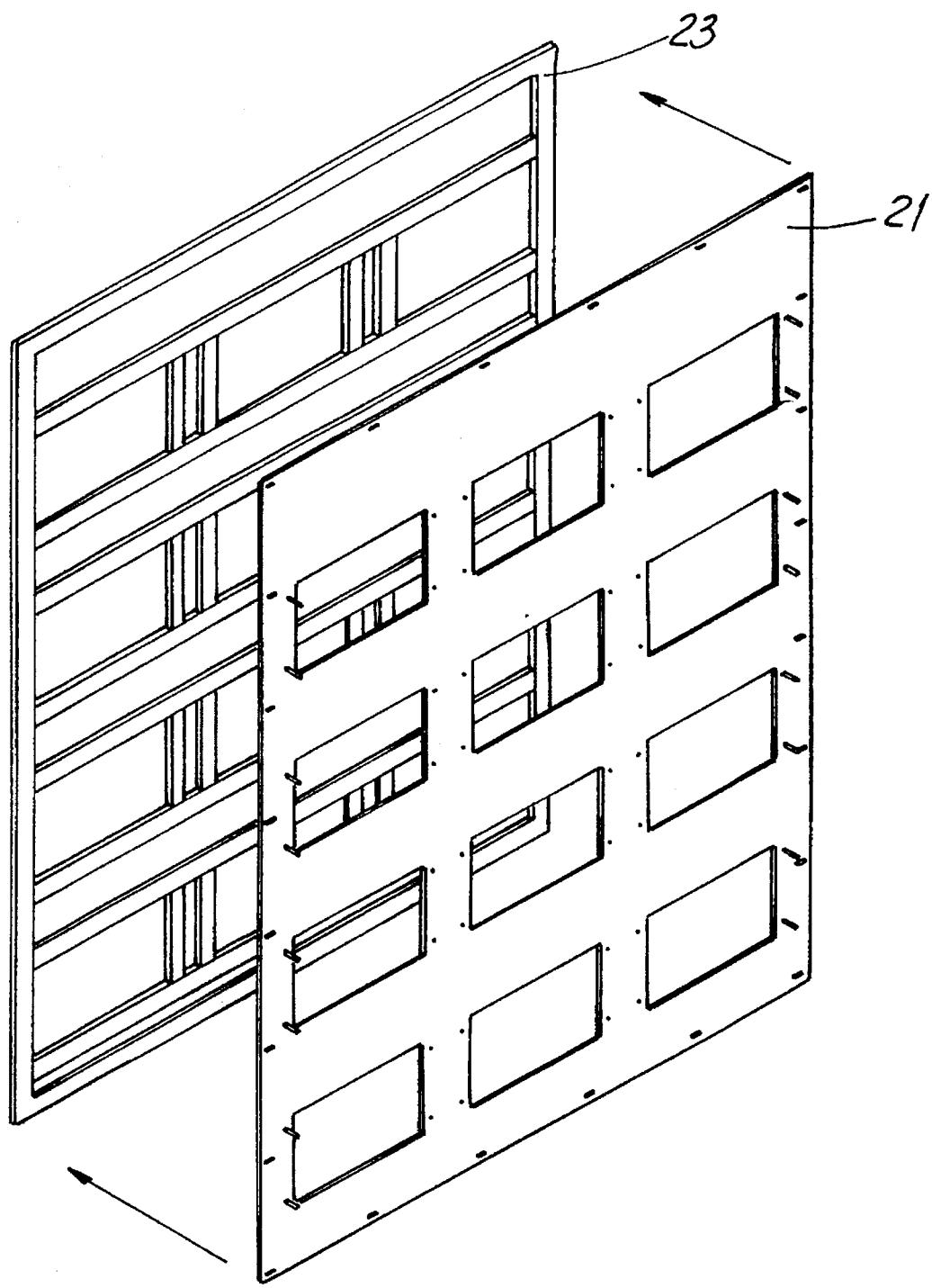
FIG. 3 is a perspective view of an exterior panel and a gasket section used with the partitioning frame of FIG. 2 to make the rear wall of the test chamber shown in FIG. 1.
Figure 4:
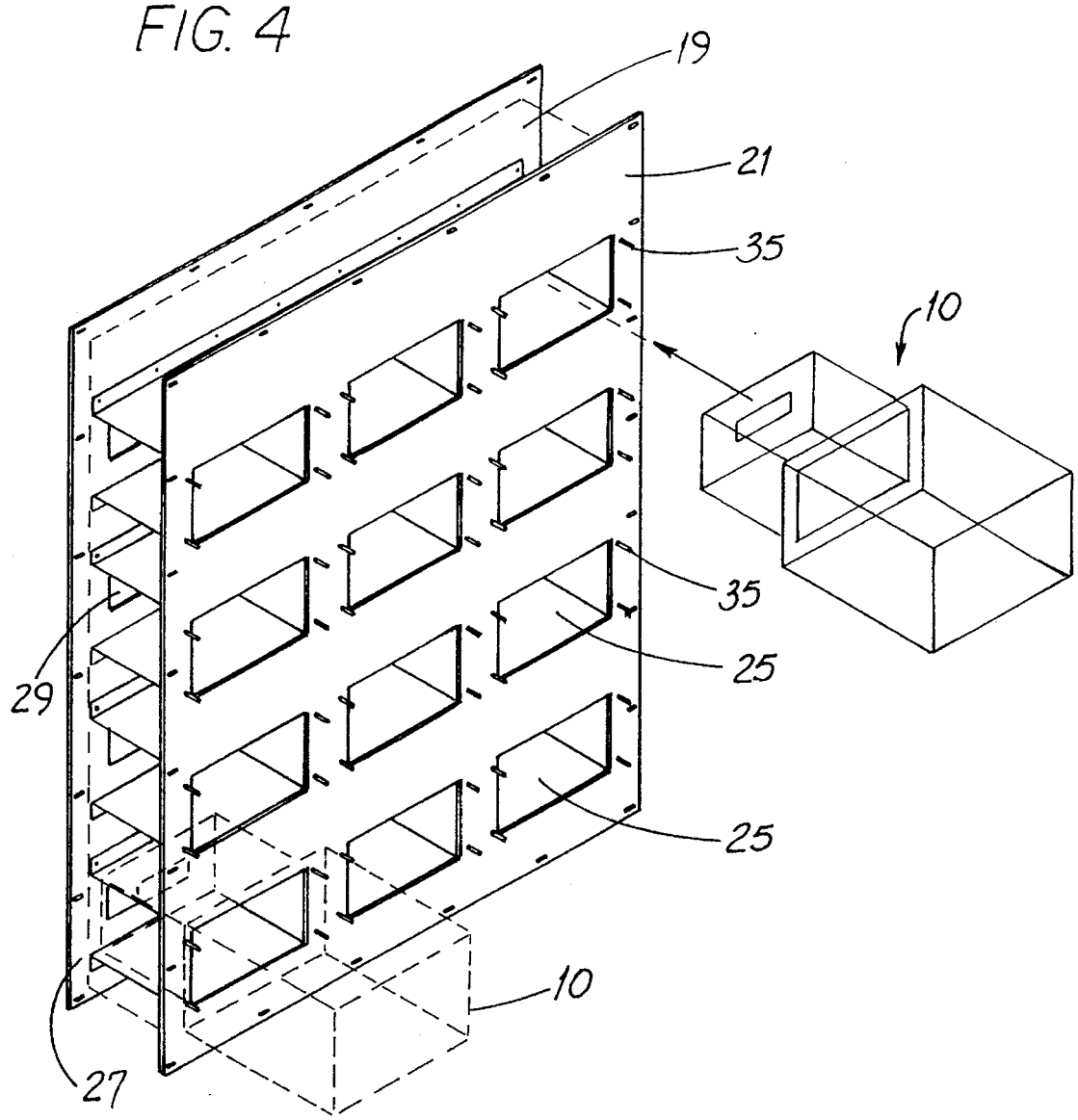
FIG. 4 is a perspective view of the frame, gasket section and exterior panel of FIGS. 2 and 3 assembled to form the test chamber rear wall. A load carrier is shown partly in phantom in solid outline and another load carrier is shown in dashed outline. Certain surfaces are also shown in dashed outline.

Before describing the new carrier 10, it will be helpful to have an understanding of certain aspects of the chamber 11. Referring also to FIGS. 2, 3 and 4, the rear chamber wall 17 includes a partitioning frame 19, an exterior panel 21 and a gasket section 23 interposed between the frame 19 and the panel 21. FIG. 4 shows the frame 19 and the panel 21 and the gasket section 23 assembled to one another and shows how those parts 25 define ports for mounting load carriers 10.

Figure 5:
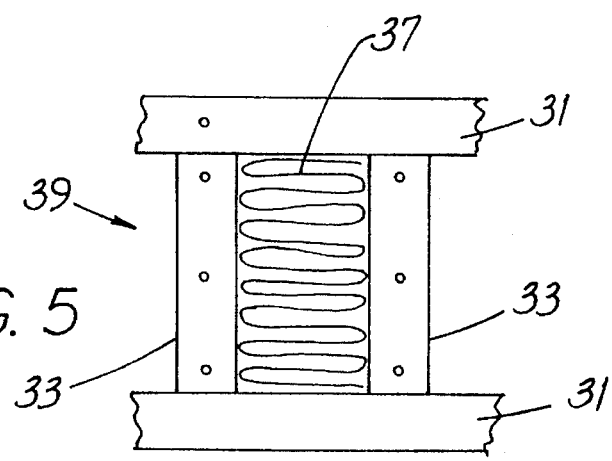
FIG. 5 is a front elevation view taken generally along the viewing axis VA 5 of FIG. 2 and showing insulation between webs used in the partitioning frame of FIG. 2.

The frame 19 includes an interior panel 27 having apertures 29 therethrough and the purpose of such apertures 29 is explained below. Several elongate, horizontally-disposed divider members 31 are attached to the panel 27 and are vertically spaced from one another. Each pair of members 31, e.g., members 31a and 31b, has one or more pairs of vertically-arranged webs 33 mounted and extending therebetween and each web 33 has a pair of threaded studs 35 protruding rearward from it. As will be appreciated from the following description, the studs 35 are used to mount carriers 10 on the rear chamber wall 17. As shown in FIG. 5, insulation 37 is packed in the space between the webs 33 comprising a web pair 39.

Figure 7:
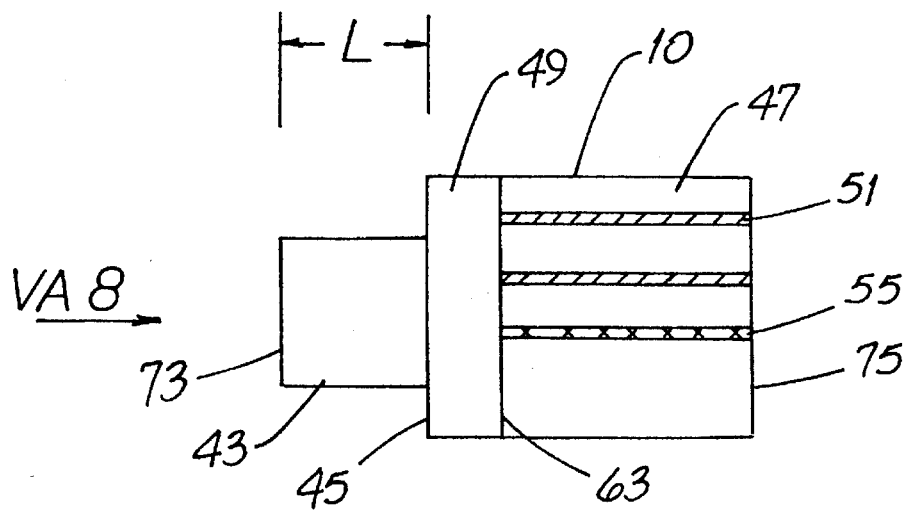
FIG. 7 is a top plan view of a load carrier taken generally along the viewing axis VA 7 of FIG. 1. The carrier top cover is removed.
Figure 6:
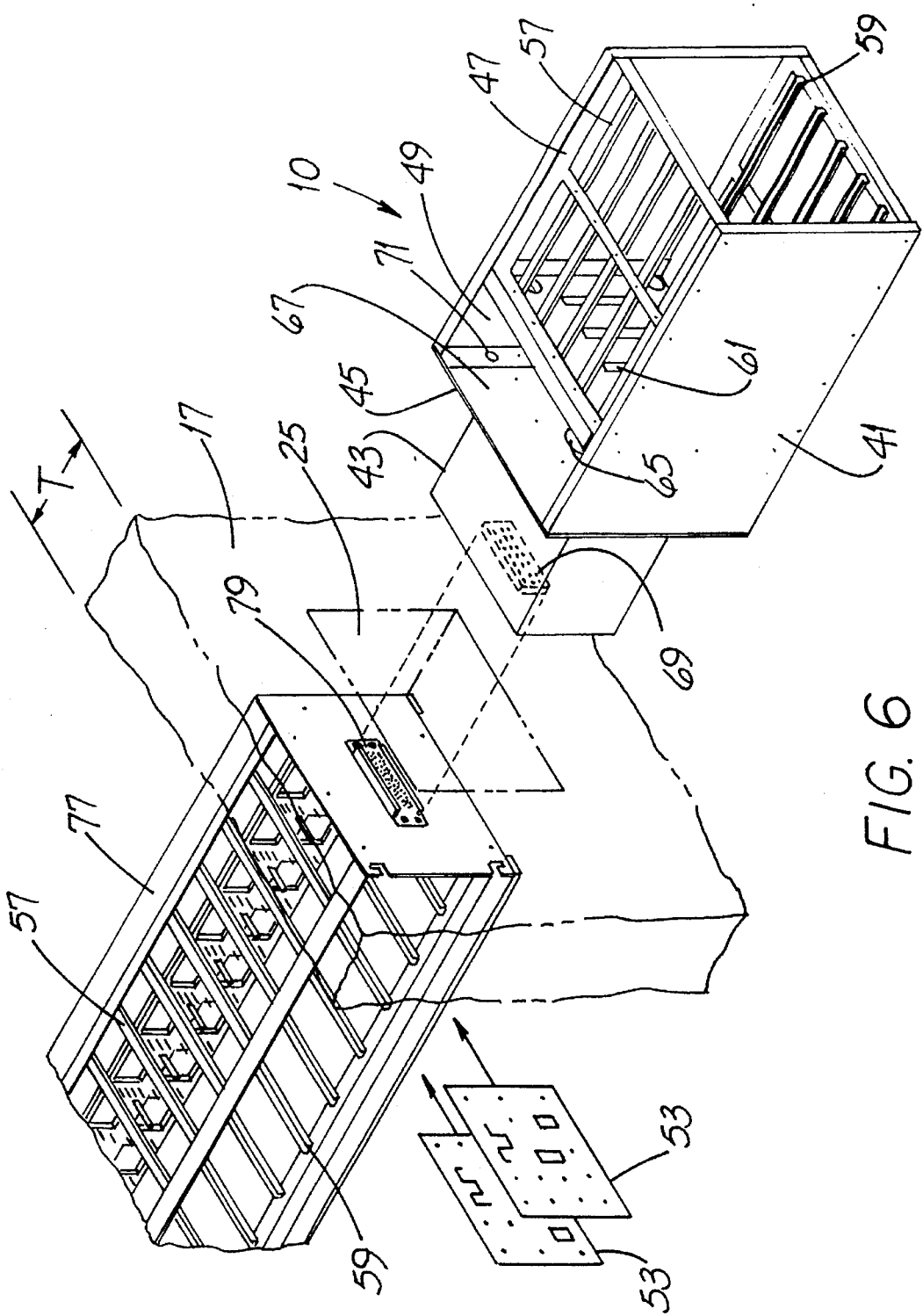
FIG. 6 is a perspective view showing a load carrier and a circuit board rack in position to be plugged together. Parts are broken away. The rear chamber wall, with parts broken away, is shown in dashed outline as are certain other surfaces.

Referring also to FIGS. 6 and 7, the new load carrier 10 has a carrier portion 41, an insertion portion 43 and a flange 45 interposed between the portions 41, 43 for sealing contact with the rear chamber wall 17. The carrier portion 41 is divided into a load compartment 47 and a barrier compartment 49 and in use, the compartment 47 contains one or more test devices such as a printed circuit "card" 51 used to impose a load, e.g., a resistive and/or inductive load, upon the printed circuit boards 53 under test in the chamber 11. And the carrier 10 may also hold some electronic circuitry 55, e.g., a computer board, "linking" the cards 51 and the equipment 13.

Each such card 51 is supported "tongue-and-groove" fashion by spaced, generally parallel, channel-like top and bottom card guides 57, 59, respectively, mounted in the carrier 10. Edge connectors are mounted in each of spaced vertical slits 61 formed in the barrier panel 63 and such connectors are "hard-wired" through the barrier compartment 49, through the opening 65 in the panel 67 and through the insertion portion 43. Such edge connectors are thereby electrically coupled to a multi-prong male connector 69 at the forward part of the insertion portion 43. Like the space between the webs 33, the barrier compartment 49 is packed with insulation.

The barrier compartment 49 constitutes what may be termed an "atmospheric barrier." Specifically, such compartment 49 (which is not tightly sealed) prevents moisture from migrating through the insertion portion 43 to the load compartment 47.

Stud-receiving openings 71 are formed in the flange 45 and open into the barrier compartment 49. Such openings 71 and the studs 35 are cooperatively sized and located so that respective studs 35 and openings 71 are in registry with one another when a carrier 10 is mounted to the rear wall 17. The carrier 10 is secured in place by wing nuts or the like threaded onto the studs 35.

From the foregoing, it is to be appreciated that the insertion portion 43 of each carrier 10 has a length "L" which substantially equal to the thickness "T" of the rear chamber wall 17. Thus, when a carrier 10 is mounted, its male connector 69 is about flush with the interior panel 27 and is accessible from within the chamber 11.

Figure 8:
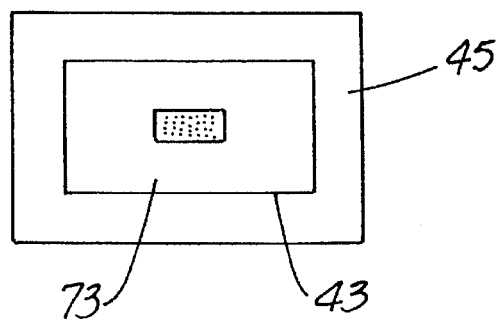
FIG. 8 is a representative front elevation view of a load carrier taken generally along the viewing axis VA 8 of FIG. 7.

It is also to be appreciated that the area of the front face 73 of the insertion portion 43 is less than the area of the rear face 75 of the carrier portion 41. The difference between such areas constitutes the area of the flange 43. FIG. 8 helps appreciate this relationship. In a highly preferred embodiment, the area of the front face 73 is in the range of about 30% to 80% of the area of the rear face 75. To put it another way, the preferred area of the flange 45 is in the range of about 20% to 70% of the area of the rear face 75.

Referring particularly to FIG. 6, circuit boards 53 undergoing test are edge-mounted within one or more drawer-like racks 77 using guides 57, 59 for the purpose. Each board 53 is plugged into one or more edge connectors hard-wired to the multi-pin female connector 79 at the rearward end of the rack 77. In practice, there are a number of racks 77 within a particular chamber 11 and in the exemplary illustrated embodiment there are twelve racks 77 and a corresponding number of load carriers 10.

In use, appropriate test devices such as card(s) 51 and, perhaps, electronic test circuitry 55 are installed in the load carriers 10. Such carriers 10 are then mounted to the chamber 11 by extending their insertion portions 43 into the ports 25 in the rear chamber wall 17. Each load carrier 10 is secured in place using the appropriate studs 35.

Printed circuit boards 53 to undergo test are mounted in racks 77 and the latter placed within the chamber 11 using suitable frames, shelves, carts or the like. The racks 77 are pushed rearward so that the female connector 79 on each rack 77 engages with the male connector 69 on the respective load carrier 10. While racks 77 may be manipulated individually in sequence, such racks 77 may also be "gang" mounted on a cart or the like and drawn simultaneously into engagement with the load carriers 10 using a powered loading mechanism. Thereupon, the circuit boards 53 are tested.

From the foregoing, the several advantages of the new load carrier 10 will now be appreciated. The load carriers 10 of a particular chamber 11 can have differing types of cards 51 for load-testing different types of circuit boards 53. Such cards 51 may be quickly and easily changed to accommodate different types of circuit boards 53 to be tested. And if a connector 69 or 79 malfunctions, it is a simple matter to remove that rack 77 or load carrier 10 (as the case may be) from service and replace it with a substitute, pending connector repair or replacement.

While the principles of the invention have been disclosed in connection with specific embodiments, it is to be understood clearly that such embodiments are exemplary and not limiting.

What is claimed:

1. In the combination of a test chamber having an interior wall, an exterior wall and at least one product carrier in the chamber and holding products to be tested, the improvement wherein:

the product carrier includes an electrical connector adjacent to the interior wall when the product carrier is positioned for product testing;

the combination includes a load carrier supported by the chamber and having a carrier portion outside the chamber and protruding away from the chamber exterior wall, the carrier portion having spaced rigid walls forming a compartment containing a test device for imposing a load on the products to be tested;

the load carrier includes a walled insertion portion extending away from the carrier portion, toward the chamber interior wall and having an electrical connector coupled to the electrical connector of the product carrier; and the load carrier has a flange interposed between the portions for sealing contact with the exterior wall.

2. The combination of claim 1 wherein the carrier portion includes a slide rack and the test device is mounted on the slide rack.

3. The combination of claim 1 including a work cell computer remotely mounted from the load carrier and wherein:

the products to be tested are connected to the computer through the compartment outside the chamber.

4. The combination of claim 3 wherein:

the products to be tested are mounted in the product carrier, are inside the chamber and are electrically connected to the insertion portion;

the insertion portion is connected to the test device; and the test device is connected to the computer.

5. The combination of claim 1 wherein:

the insertion portion and the carrier portion are coupled to the flange; and the flange is generally planar and substantially parallel to the chamber exterior wall.

6. A test apparatus including:

a chamber having an interior cavity and a wall with an opening therethrough, the wall having an exterior panel;

a rigidly-constructed load carrier for connection to a product carrier in the interior cavity, such load carrier having an insertion portion and a carrier portion attached to one another, and wherein:

the insertion portion and the opening are conformably sized;

the insertion portion slidably extends inwardly through the exterior panel and into the opening toward the chamber interior cavity; and the carrier portion extends outwardly from the exterior panel and is outside the chamber.

7. The apparatus of claim 6 wherein:

the chamber wall has an interior panel spaced inwardly from the exterior panel;

the insertion portion has a length which is about equal to the dimension between the interior and exterior panels;

the insertion portion has an end panel which is substantially coplanar with the interior panel of the chamber wall and which includes a connector mounted thereon.

8. The apparatus of claim 7 wherein:

the insertion portion includes a front face having an area;

the carrier portion includes a rear face outside the chamber and having an area substantially greater than the area of the front face.

9. The apparatus of claim 6 wherein:

the carrier portion contains a test device;

the chamber contains circuit boards; and the circuit boards are connected to the test device through the load carrier.

10. The apparatus of claim 6 wherein:

the chamber is surrounded by ambient air;

the carrier portion is in the ambient air and supports at least one test device mounted in a test compartment of the carrier portion.

11. The apparatus of claim 10 wherein:

the insertion portion and the test compartment of the load carrier are separated by a barrier compartment which substantially prevents moisture from migrating from the insertion portion to the test compartment.

* * * * *

UNITED STATES PATENT AND TRADEMARK OFFICE
CERTIFICATE OF CORRECTION

PATENT NO. : 5,528,161

DATED : June 18, 1996

INVENTOR(S) : Peter A. Liken et al.

It is certified that error appears in the above-identified patent and that said Letters Patent are hereby corrected as shown below:

On the title page: item [56]
In "References Cited U.S. PATENT DOCUMENTS", between ."5,003,136  3/1991  Kilpatrick et al...............219/209" and " 5,072,177  12/1991  Liken et al..........324/156F"  add:
--5,021,732  6/1991  Fuoco et al..............324/158F-- .

In column 4, line 65, delete "and the gasket section 23"

Signed and Sealed this

Twenty-fourth Day of September, 1996

Attest:

BRUCE LEHMAN

Attesting Officer     Commissioner of Patents and Trademarks